United States Patent
Koketsu et al.

(10) Patent No.: US 11,796,603 B2
(45) Date of Patent: Oct. 24, 2023

(54) METHOD OF ESTIMATING INTERNAL DEGRADATION STATE OF DEGRADED CELL, AND MEASUREMENT SYSTEM OF CARRYING OUT THE METHOD

(71) Applicant: HONDA MOTOR CO., LTD., Tokyo (JP)

(72) Inventors: Seiichi Koketsu, Wako (JP); Shunsuke Konishi, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 17/677,046

(22) Filed: Feb. 22, 2022

(65) Prior Publication Data
US 2022/0299576 A1    Sep. 22, 2022

(30) Foreign Application Priority Data

Mar. 18, 2021    (JP) .................................. 2021-044815

(51) Int. Cl.
| | | |
|---|---|---|
| G01R 31/392 | (2019.01) | |
| G01R 31/396 | (2019.01) | |
| H01M 10/48 | (2006.01) | |
| H01M 10/0525 | (2010.01) | |

(52) U.S. Cl.
CPC ......... *G01R 31/392* (2019.01); *G01R 31/396* (2019.01); *H01M 10/48* (2013.01); *H01M 10/0525* (2013.01)

(58) Field of Classification Search
None
See application file for complete search history.

(56) References Cited

U.S. PATENT DOCUMENTS

| | | | |
|---|---|---|---|
| 2013/0335009 A1* | 12/2013 | Katsumata | ............ H02J 7/0042 702/63 |
| 2016/0254687 A1* | 9/2016 | Tanaka | ................ H01M 10/425 320/112 |

FOREIGN PATENT DOCUMENTS

JP    2015-087344 A    5/2015

* cited by examiner

*Primary Examiner* — Jas A Sanghera
(74) *Attorney, Agent, or Firm* — Carrier, Shende & Associates P.C.; Joseph P. Carrier; Jeffrey T. Gedeon

(57) ABSTRACT

In a method of estimating an internal degradation state of a degraded cell, a measurement system calculates a target capacity characteristic curve by differentiating current capacity by voltage on a target charge curve of a target battery. Further, the method obtains changes of parameters of different types based on a fitting operation that fits the curve and a reference capacity characteristic curve calculated from reference data. In the fitting operation, whichever of low current capacity regions and high current capacity regions of the curve and the curve have a stronger correlation are fit first and whichever of them have a weaker correlation are fit later.

8 Claims, 11 Drawing Sheets

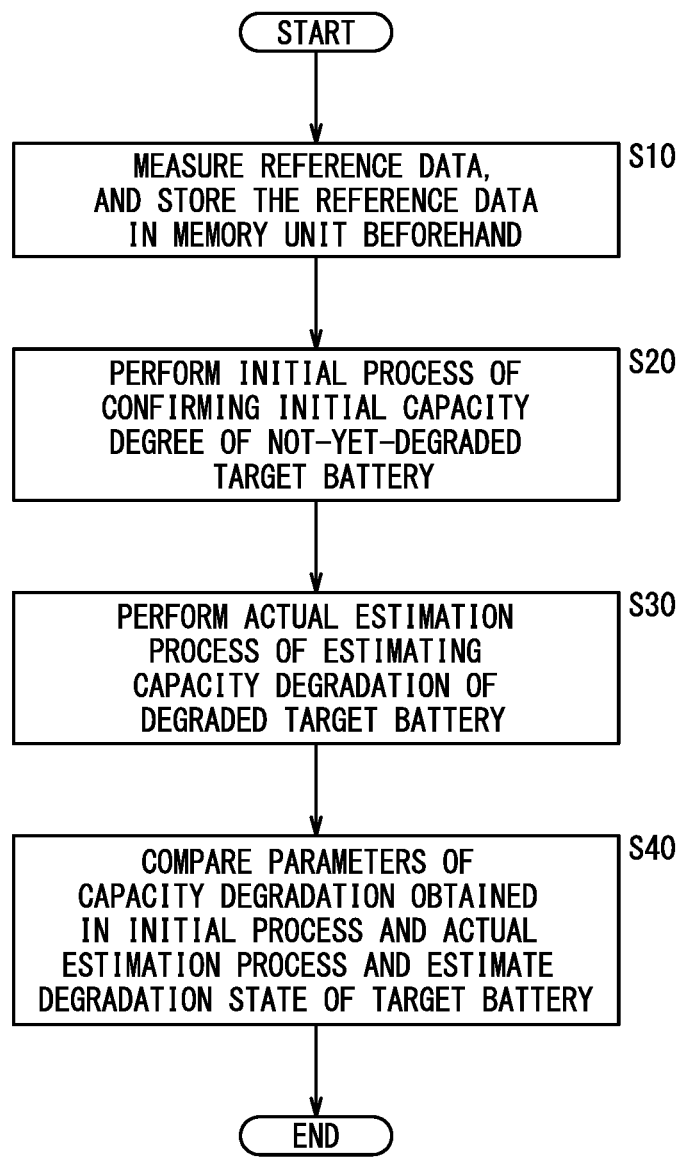

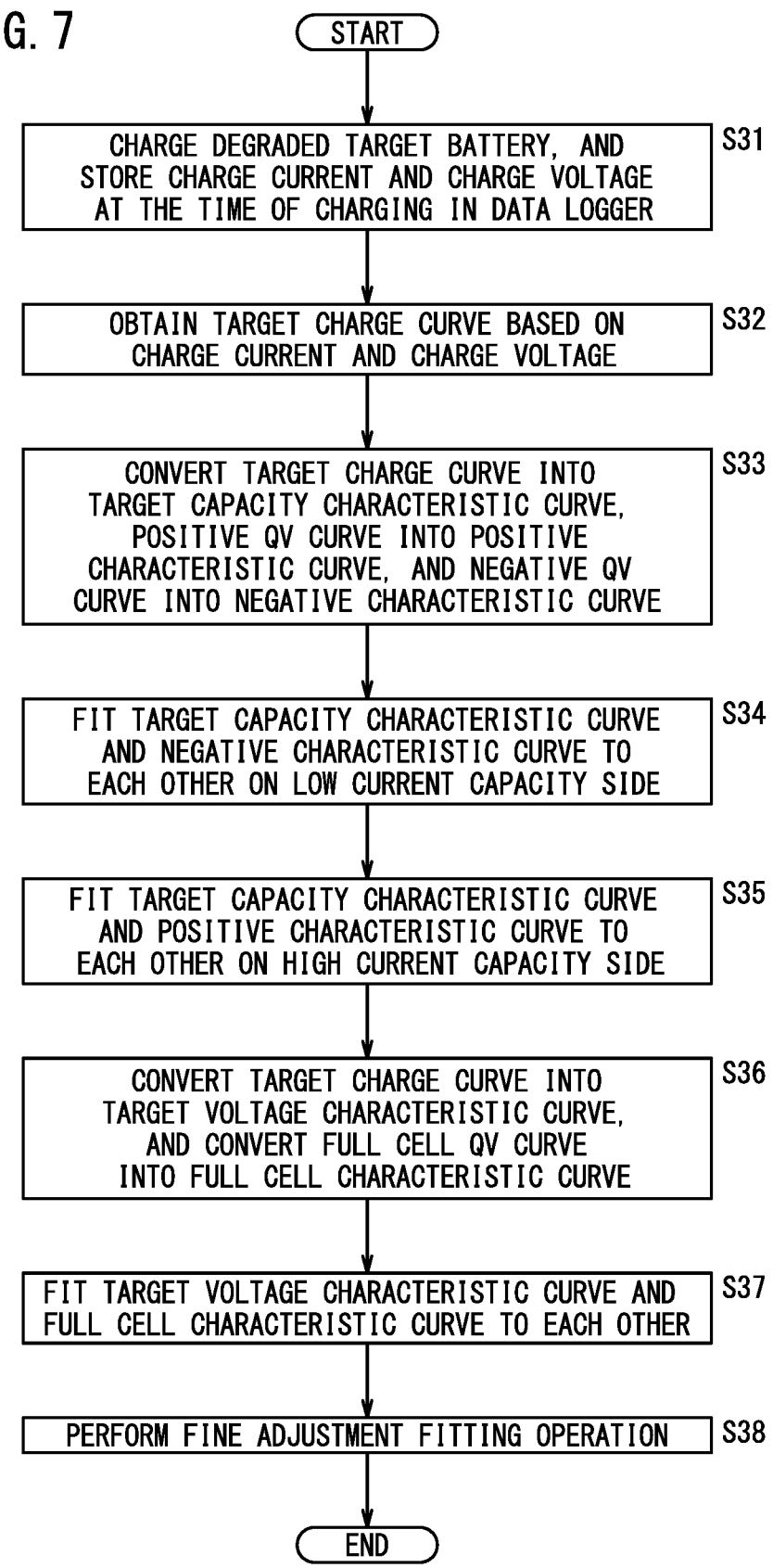

METHOD OF ESTIMATING INTERNAL DEGRADATION STATE OF DEGRADED CELL, AND MEASUREMENT SYSTEM OF CARRYING OUT THE METHOD

CROSS-REFERENCE TO RELATED APPLICATIONS

This application is based upon and claims the benefit of priority from Japanese Patent Application No. 2021-044815 filed on Mar. 18, 2021, the contents of which are incorporated herein by reference.

BACKGROUND OF THE INVENTION

Field of the Invention

The present invention relates to a method of estimating an internal degradation state of a degraded cell of a secondary battery, and a measurement system of carrying out the method.

Description of the Related Art

JP 2015-087344 A discloses a half cell fitting method of estimating capacity degradation of a secondary battery, based on an electromotive force curve of a positive electrode and a negative electrode of the secondary battery. In the method of estimating the internal degradation state, either one of the electromotive force curve of a new battery or the electromotive force curve of a degraded battery is changed in a manner that one of the electromotive force curves fits the other. Based on changes of fitting parameters when one of the electromotive force curves is changed, the capacity degradation is estimated.

SUMMARY OF THE INVENTION

However, in the conventional method of estimating the internal degradation state of the degraded cell, at the time of fitting the not-yet-degraded electromotive force curve to the degraded electromotive force curve, when the fitting parameters of one curve is changed, the fitting parameters of the other curve are affected. When the fitting parameters of one curve are adjusted and the fitting parameters of the other curve are fitted, it cannot be determined which one's fitting parameters are the cause of the degradation.

The present invention has been made taking the above circumstances into account, and an object of the present invention is to provide a method of estimating an internal degradation state of a degraded cell, and a measurement system of carrying out the method that can significantly improve the reproducibility, the reliability, and the easiness of understanding of an estimation of a battery capacity degradation state by performing a fitting operation in consideration of electrochemical characteristics of a battery.

In order to achieve the above object, according to a first aspect of the present invention, a method of estimating an internal degradation state a degraded cell is provided. The method includes obtaining a target charge curve represented by the current capacity and the voltage for a target battery that is a target of estimation of capacity degradation, obtaining a derivative by differentiating the current capacity with respect to the voltage in the target charge curve and calculating a target capacity characteristic curve represented by the current capacity and the derivative, calculating, for another battery of the same type as the target battery, a reference capacity characteristic curve represented by the current capacity and the derivative based on reference data including the current capacity and the voltage, and performing an actual estimation process of estimating capacity degradation of the target battery by obtaining changes of parameters of different types based on a fitting operation of fitting the reference capacity characteristic curve and the target capacity characteristic curve to each other.

In the fitting operation, a low current capacity fitting operation of fitting the reference capacity characteristic curve and the target capacity characteristic curve in the low current capacity region having a stronger correlation is performed, and thereafter, a high current capacity fitting operation of fitting the reference capacity characteristic curve and the target capacity characteristic curve in the high current capacity region having a weaker correlation is performed.

Further, in order to achieve the above object, according to a second aspect of the present invention, a measurement system is provided. The measurement system performs a method of estimating an internal degradation state of a degraded cell. The measurement system includes a charger that charges a target battery that is a target of estimation of capacity degradation, and an estimation apparatus connected to the charger. The estimation apparatus is configured to obtain a target charge curve represented by the current capacity and the voltage based on charge current and charge voltage supplied to the target battery, obtain a derivative by differentiating the current capacity with respect to the voltage in the target charge curve and calculate a target capacity characteristic curve represented by the current capacity and the derivative, calculate, for another battery of the same type as the target battery, a reference capacity characteristic curve represented by the current capacity and the derivative based on reference data including the current capacity and the voltage, and perform an actual estimation process of estimating capacity degradation of the target battery by obtaining changes of parameters of different types based on a fitting operation of fitting the reference capacity characteristic curve and the target capacity characteristic curve to each other.

In the fitting operation, the reference capacity characteristic curve and the target capacity characteristic curve are separated into low current capacity regions and high current capacity regions, and whichever of the low current capacity regions and the high current capacity regions have a stronger correlation are fit first and the other regions having a weaker correlation are fit later.

In the method of estimating the internal degradation state of the degraded cell, and the measurement system of carrying out the method, by performing the fitting operation in consideration of electrochemical characteristics of the battery, it is possible to significantly improve the reproducibility, the reliability, and easiness of understanding to a greater extent.

The above and other objects, features and advantages of the present invention will become more apparent from the following description when taken in conjunction with the accompanying drawings in which a preferred embodiment of the present invention is shown by way of illustrative example.

Figure 4:
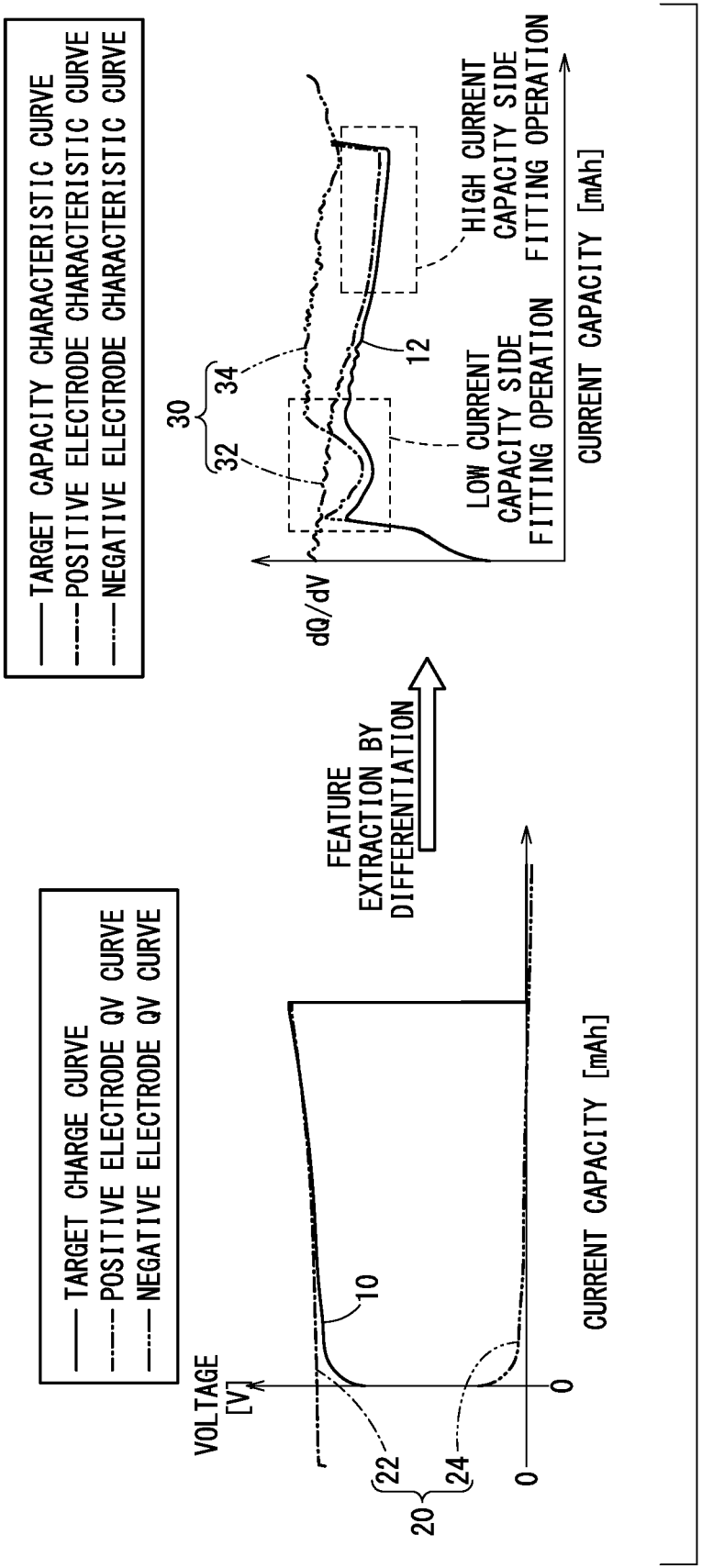
Figure 5:
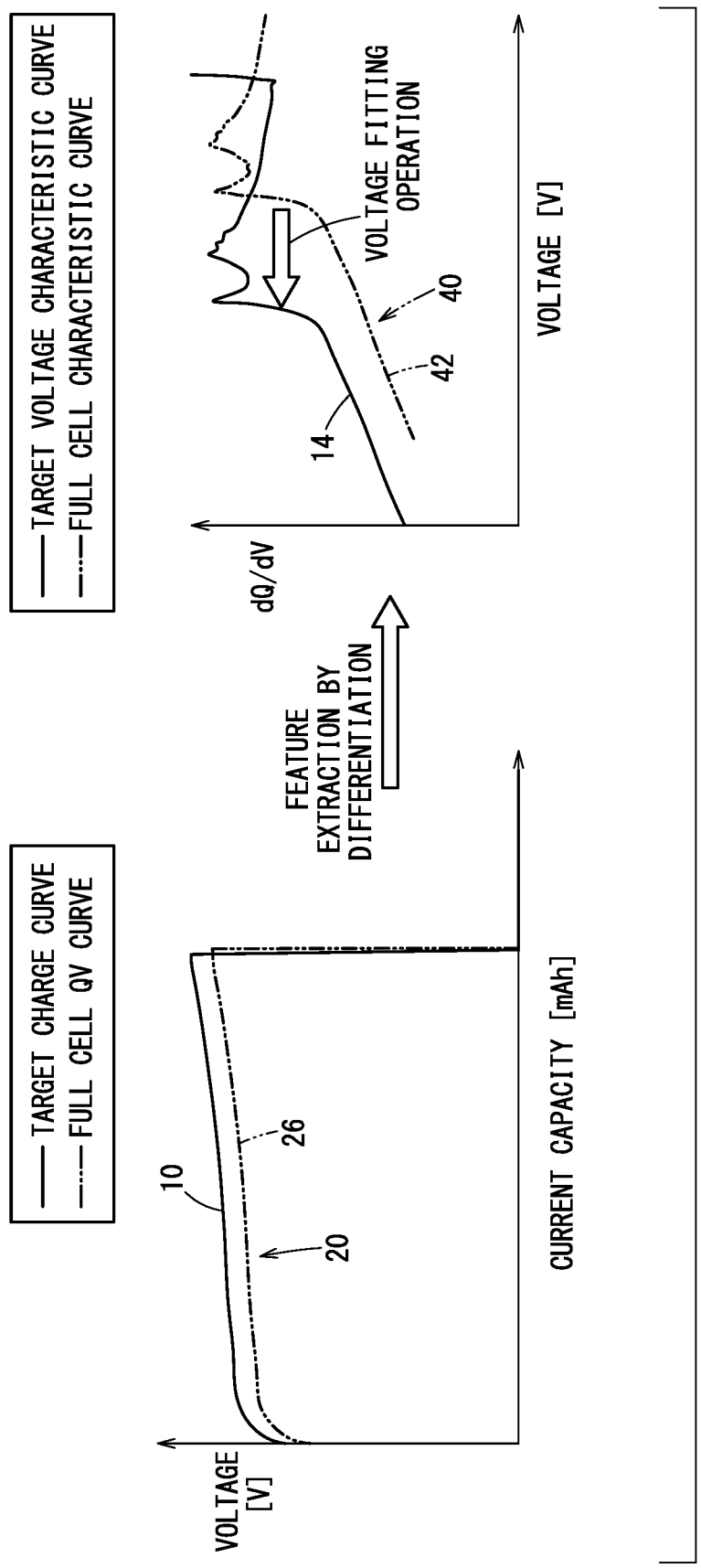
Figure 8A:
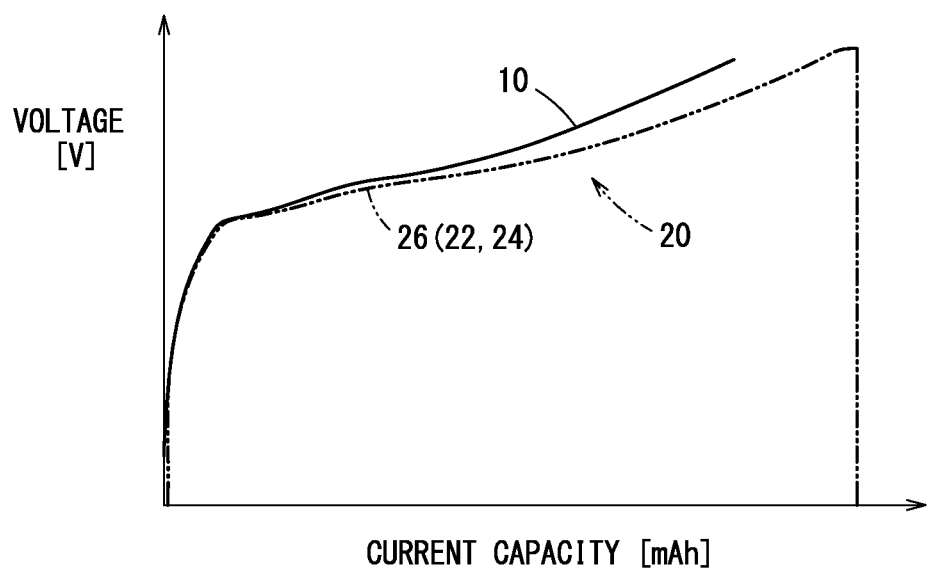
Figure 8B:
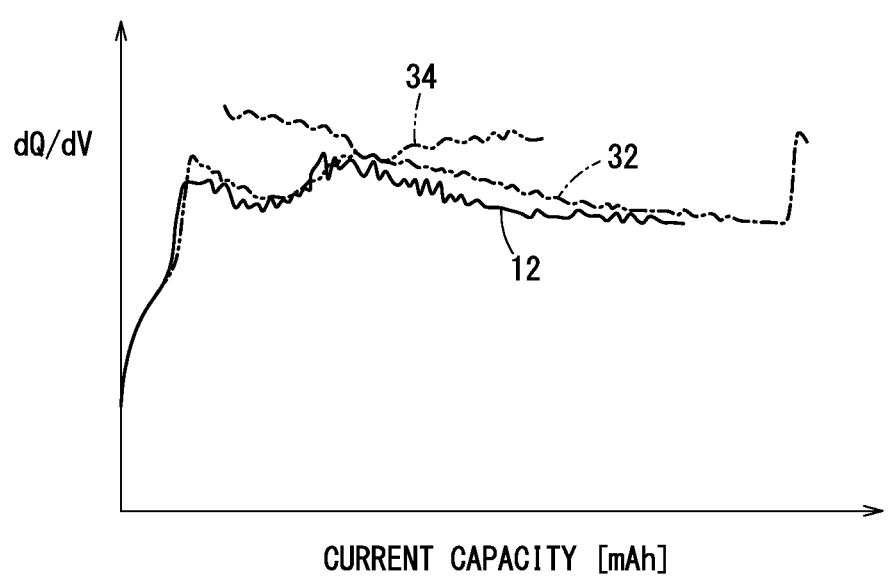
Figure 9A:
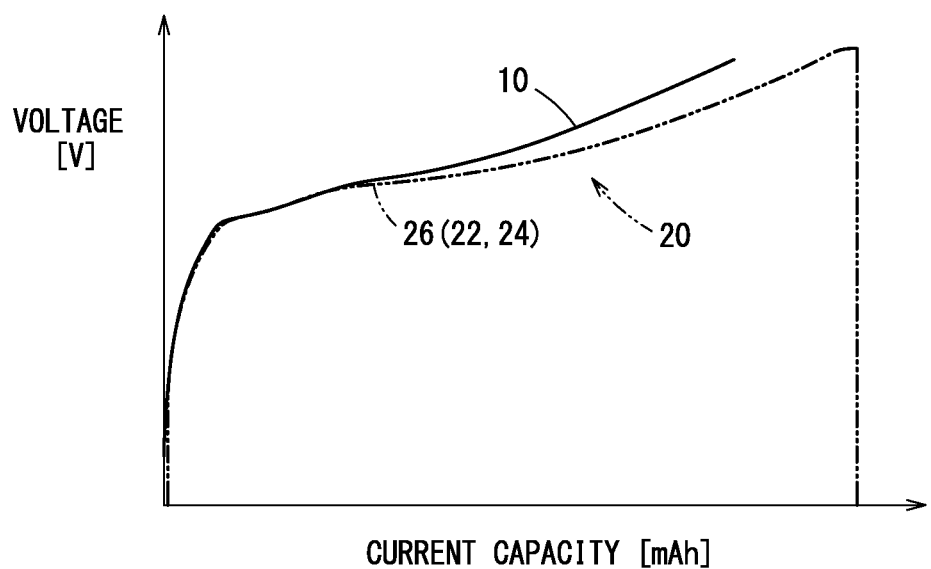
Figure 9B:
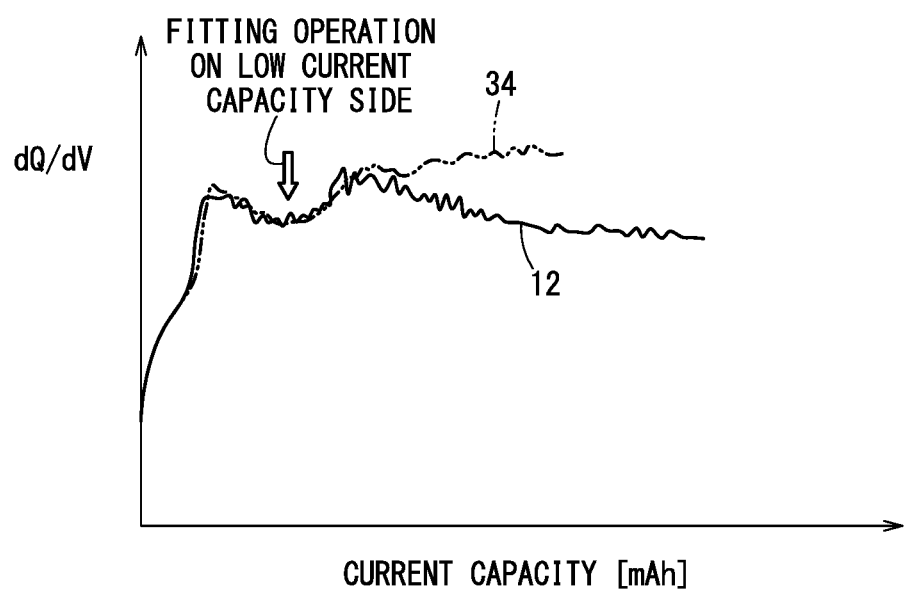
Figure 10A:
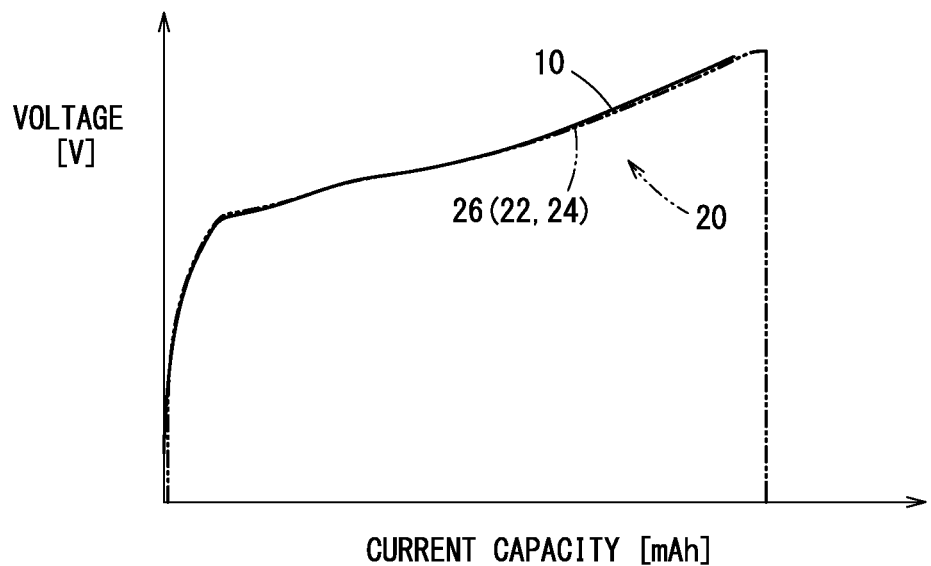
Figure 10B:
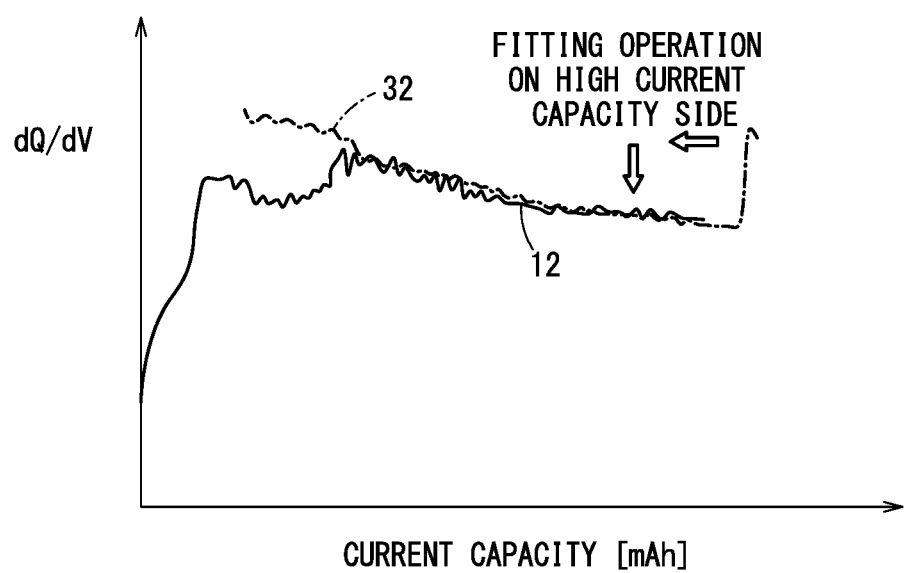
Figure 11A:
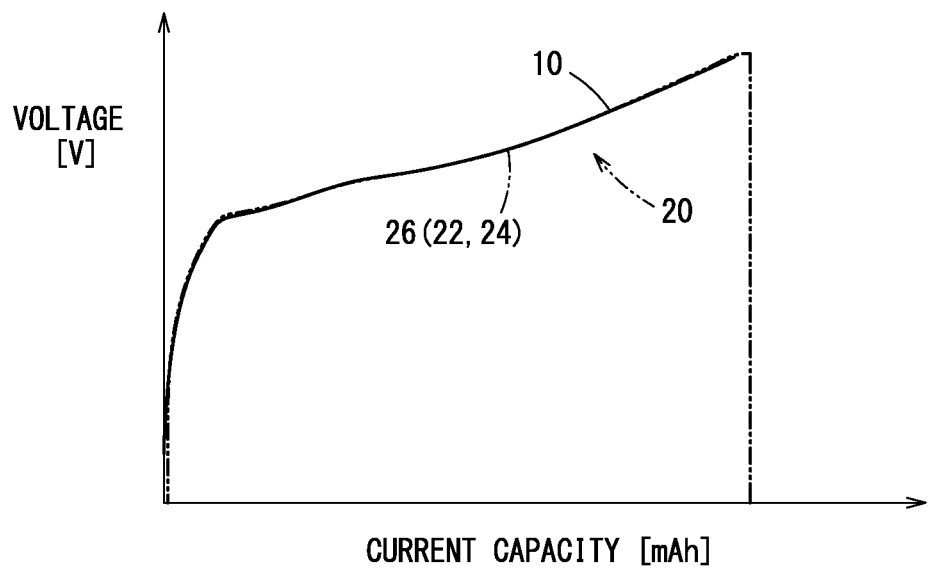
Figure 11B:
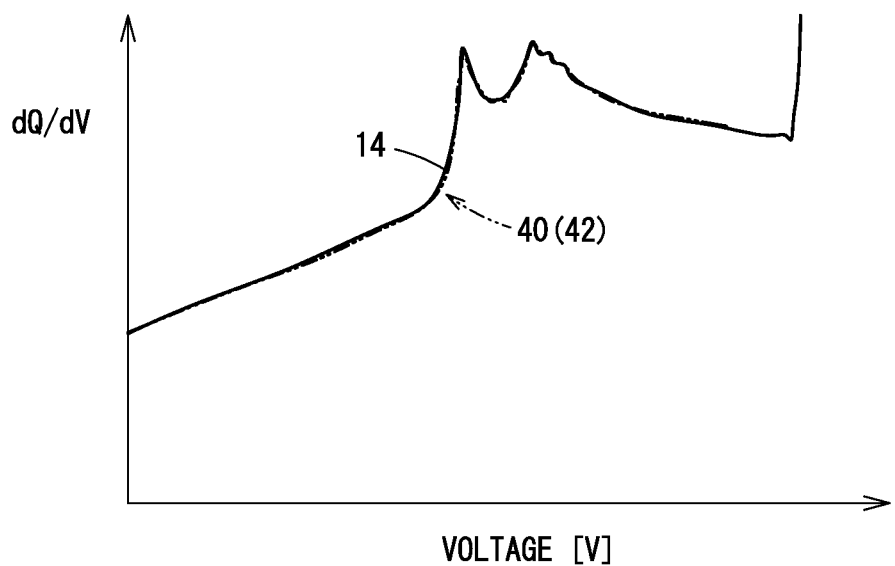

The left graph in FIG. 4 is a graph showing a charge curve, and the right graph in FIG. 4 is a graph showing a characteristic curve of a derivative obtained by differentiating the current capacity with respect to the voltage for the charge curve and the current capacity;

The left graph in FIG. 5 is a graph showing the charge curve, and the right graph in FIG. 5 is a graph showing the characteristic curve of a derivative obtained by differentiating the current capacity with respect to the voltage for the charge curve and the voltage;

FIG. 6 is a flow chart showing the process flow of a method of estimating the internal degradation state of a degraded cell;

FIG. 7 is a flow chart showing an actual estimation process of the method of estimating the internal degradation state of the degraded cell;

FIG. 8A is a first charge curve graph for explaining changes of the charge curves due to fitting operations;

FIG. 8B is a first characteristic curve graph for explaining changes of the characteristic curves due to the fitting operations;

FIG. 9A is a second charge curve graph for explaining changes of the charge curves due to the fitting operations;

FIG. 9B is a second characteristic curve graph for explaining changes of the characteristic curves due to the fitting operations;

FIG. 10A is a third charge curve graph for explaining changes of the charge curves due to the fitting operations;

FIG. 10B is a third characteristic curve graph for explaining changes of the characteristic curves due to the fitting operations;

FIG. 11A is a fourth charge curve graph for explaining changes of the charge curves due to the fitting operations; and FIG. 11B is a fourth charge curve graph for explaining changes of the characteristic curves due to the fitting operations.

DESCRIPTION OF THE INVENTION

Hereinafter, a preferred embodiment of the present invention will be described with reference to the accompanying drawings.

Figure 1:
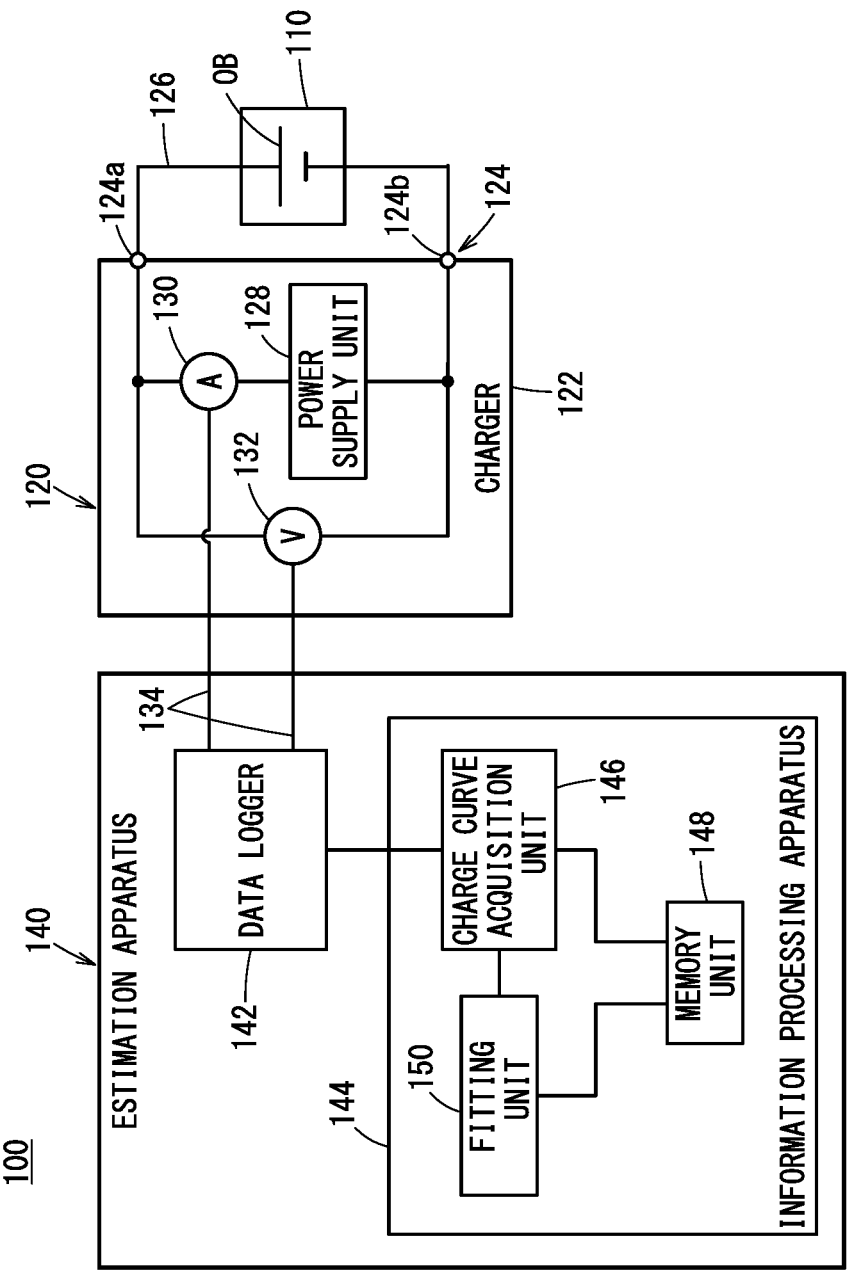
FIG. 1 is a diagram showing a measurement system for carrying out a method of estimating an internal degradation state of a degraded cell according to an embodiment of the present invention.

In a method of estimating the internal degradation state of a degraded cell according to an embodiment of the present invention, as shown in FIG. 1, capacity degradation of a battery as a target of measurement (hereinafter referred to as the target battery OB) is estimated using a measurement system 100. The measurement system 100 includes a placement unit 110, a charger 120, and an estimation apparatus 140. The target battery OB is set to the placement unit 110. The charger 120 charges the target battery OB set to the placement unit 110. The estimation apparatus 140 is connected to the charger 120 in a manner that the estimation apparatus 140 and the charger 120 can communicate with each other, and the estimation apparatus 140 actually estimates the capacity degradation of the target battery OB.

The target battery OB has a positive electrode and a negative electrode for outputting electrical power (current/voltage) and is a rechargeable secondary battery that is rechargeable through the positive electrode and the negative electrode. The type of secondary battery is not limited and can include lithium ion secondary batteries, lithium ion polymer secondary batteries, lead acid rechargeable batteries, or nickel based rechargeable batteries, etc. This embodiment describes a case as an example where a lithium ion secondary battery is the target battery OB. The number of target batteries OB measured by the measurement system 100 is not limited to one. A plurality of target batteries OB may be measured by the measurement system 100.

The charger 120 includes a casing 122, and a pair of terminals 124 (a positive terminal 124a and a negative terminal 124b) attached to the casing 122. The pair of terminals 124 are electrically connected to the target battery OB set to the placement unit 110 through electrical wiring 126. In the casing 122 are provided a power supply unit 128 capable of supplying electric power to the pair of terminals 124, an ammeter 130 detecting charge current supplied from the power supply unit 128 to the target battery OB, and a voltmeter 132 detecting charge voltage supplied from the power supply unit 128 to the target battery OB.

The power supply unit 128 outputs DC power (DC current, DC voltage) in correspondence with a state of the target battery OB. An energy storage type DC power supply capable of supplying DC power is used as the power supply unit 128. The power supply unit 128 may have structure where the AC power supplied from the outside of the charger 120 is converted into the DC power. The ammeter 130 is connected in serial to the power supply unit 128. The ammeter 130 detect the charge current outputted from the power supply unit 128. The voltmeter 132 is connected in parallel to the power supply unit 128 and the ammeter 130. The voltmeter 132 detects the charge voltage (inter-terminal voltage) of the target battery OB.

The estimation apparatus 140 includes a data logger 142 (memory device) connected to the charger 120 and an information processing apparatus 144 connected to the data logger 142. The data logger 142 is connected to the ammeter 130 and the voltmeter 132 of the charger 120 in a manner that the data logger 142 can communicate with the ammeter 130 and the voltmeter 132. The data logger 142 is a storage device that obtains and stores the charge current detected by the ammeter 130 and the charge voltage detected by the voltmeter 132. A known hard disk drive (HDD), a solid state drive (SSD), or an offline storage, etc. may be used as the data logger 142. Though not shown, the data logger 142 includes an input/output interface, a processor, a timer, etc. (omitted in the drawings). The input/output interface is connected to the ammeter 130, the voltmeter 132, and the information processing apparatus 144 through communication lines 134 in a manner that the input/output interface can communicate with the ammeter 130, the voltmeter 132, and the information processing apparatus 144. The processor controls writing, reading, and deletion of the charge current and the charge voltage. The charger 120 may be provided with the data logger 142. The data logger 142 may receive the charge current and/or the charge voltage from the charger 120 through wireless communication.

The data logger 142 measures time by a timer. The data logger 142 obtains the charge current and the charge voltage from the charger 120 periodically and continuously, and associates the charge current and the charge voltage with the time and accumulates them. In this manner, it is possible to obtain data for calculating a charge curve (charge characteristics, QV curve) represented by the current capacity (mAh) and the charge voltage (V) of the target battery OB.

The information processing apparatus 144 includes at least one processor, memory, input/output interface, and electronic circuit. Various types of drives (HDD, SSD, etc.)

can be adopted as the memory, or the memory may include the memory accompanying the processor or the integrated circuit. The at least one processor executes programs (not shown) stored in the memory, whereby a plurality of function blocks for performing information processing are formed in the information processing apparatus 144. At least some of the function blocks may include electronic circuits including discrete devices and integrated circuits such as ASIC (Application Specific Integrated Circuit) and FPGA (Field Programmable Gate Array).

Figure 2:
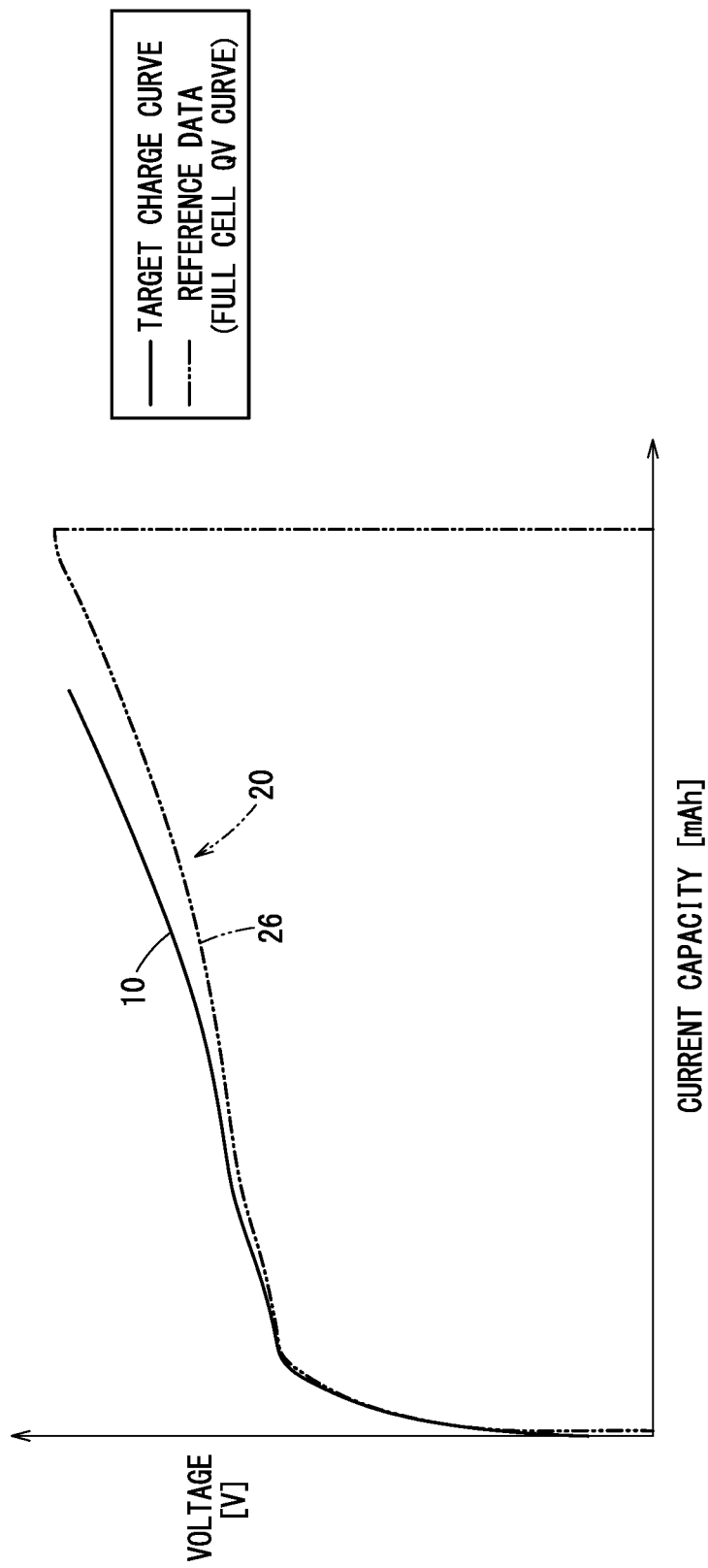
FIG. 2 is a graph showing a target charge curve of a target battery after degradation and reference data using current capacity and voltage.

Specifically, a charge curve acquisition unit 146, a memory unit 148, a fitting unit 150 are formed as the function blocks in the information processing apparatus 144. The charge curve acquisition unit 146 obtains the charge current, the charge voltage, the time, etc. accumulated in the data logger 142, and calculates a charge curve (hereinafter, "target charge curve 10") of the target battery OB. The target charge curve 10 represents the change of the voltage relative to the current capacity at the time of charging the target battery OB. FIG. 2 shows the target charge curve 10. FIG. 2 shows the target charge curve 10 as a graph where the horizontal axis represents the current capacity and the vertical axis represents the voltage.

As shown in FIGS. 1 and 2, known methods may be adopted for calculation of the target charge curve 10. As an example, the charge curve acquisition unit 146 calculates accumulated charge current based on the charge current, time etc. of the case where the target battery OB is charged from 0% to 100% (fully charged state) of the charge SOC (State of Charge). This accumulated charge current corresponds to the current capacity. The charge curve acquisition unit 146 plots the charge voltage in correspondence with the increase of the accumulated charge current, whereby the target charge curve 10 can be obtained. The charge curve acquisition unit 146 stores the obtained target charge curve 10 in the memory unit 148. In the memory unit 148, the charge curve acquisition unit 146 may store, instead of the target charge curve 10, a plurality of plots associating the current capacity and the charge voltage of the target charge curve 10 with each other. The measurement system 100 may calculate the target charge curve 10 with the data logger 142 and may transmit the target charge curve 10 to the information processing apparatus 144.

The memory unit 148 stores reference data 20 beforehand for carrying out the method of estimating the internal gradation state, instead of the target charge curve 10 obtained by the charge curve acquisition unit 146. In the embodiment of the present invention, the reference data 20 is data obtained from a destructive inspection of another battery of the same type (battery produced in the same production method) as the target battery OB that has not yet degraded (brand new, non-used state).

The fitting unit 150 performs a fitting operation that fits the target charge curve 10 and the reference data 20 stored in the memory unit 148 to each other, thereby estimating the capacity degradation of the target battery OB. Hereinafter, the factors of the capacity degradation of the battery, and the details of the fitting operation will be described.

Figure 3:
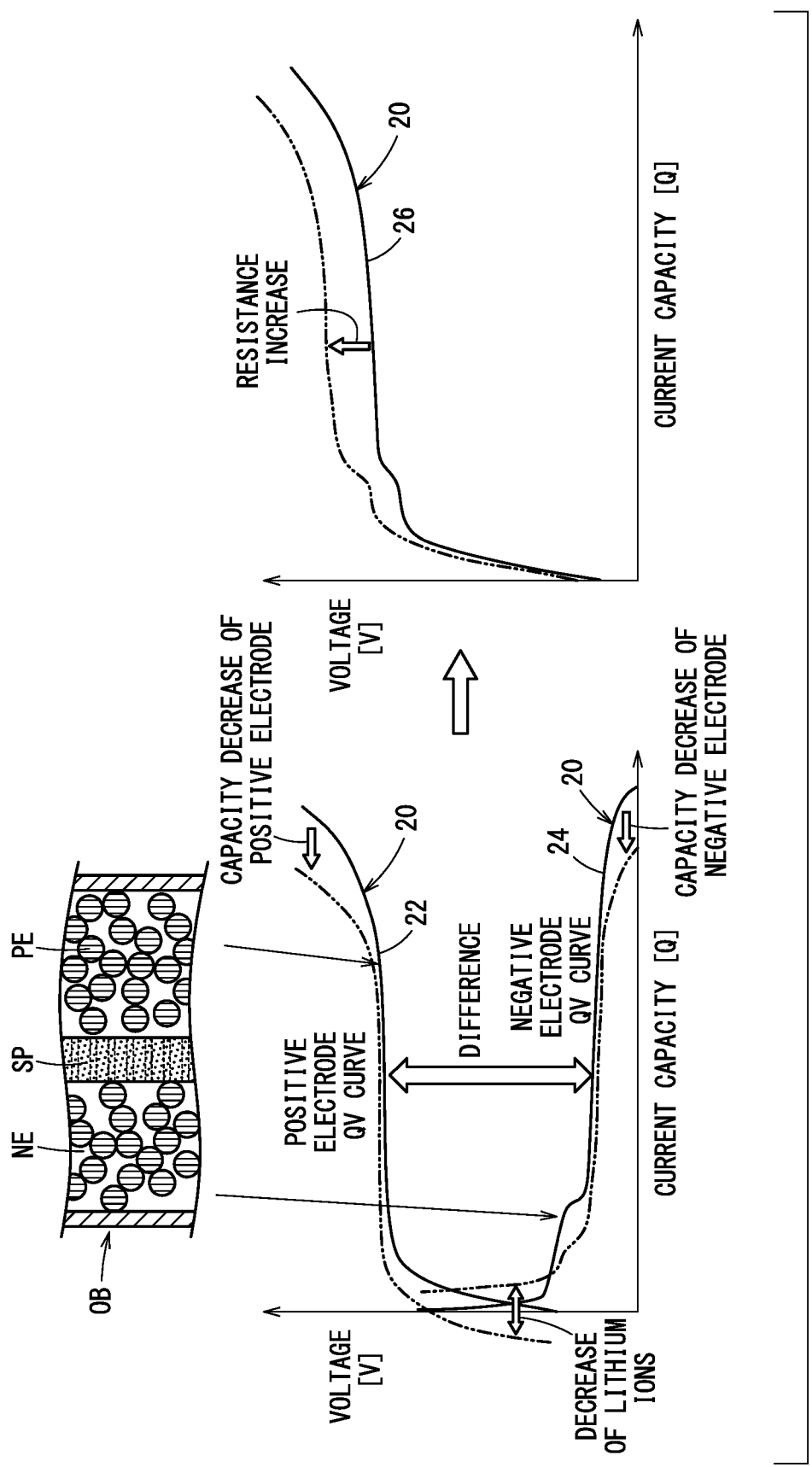
FIG. 3 is a graph illustrating factors of capacity gradation of the battery.

As shown in the left graph of FIG. 3, the secondary battery (lithium ion secondary battery) has a QV curve for each of the positive electrode PE and the negative electrode NE (hereinafter referred to as the positive electrode QV curve 22, the negative electrode QV curve 24). The positive electrode QV curve 22 and the negative electrode QV curve 24 are obtained by performing a destructive inspection. For example, the secondary battery is divided (broken) into half cells, i.e., the positive electrode PE and the negative electrode NE. For each of the divided positive electrode PE and negative electrode NE, Li foil is put on the other electrode side with a separator interposed and then charging is carried out and the charge current and the charge voltage are monitored, whereby the positive electrode QV curve 22 and the negative electrode QV curve 24 are obtained.

The positive electrode QV curve 22 is represented by a graph where the horizontal axis represents the current capacity (Q) and the vertical axis represents the voltage (V). The positive electrode QV curve 22 shows that as the current capacity increases, the voltage increases. Specifically, the positive electrode QV curve 22 shows that after the voltage increases rapidly at lower current capacities, the voltage remains substantially constant even if the current capacity increases, and the voltage increases at higher current capacities. On the other hand, the negative electrode QV curve 24 shows that as the current capacity increases, the voltage decreases. Specifically, the negative electrode QV curve 24 shows that after the voltage decreases rapidly at lower current capacities, the voltage remains substantially constant even if the current capacity increases, and the voltage decreases gradually at higher current capacities. Further, as shown in the right graph of FIG. 3, the difference between the positive electrode QV curve 22 and the negative electrode QV curve 24 becomes a charge curve between the electrodes of the secondary battery. Hereinafter, the charge curve between the electrodes shown in the right graph of FIG. 3 will be referred to as a full cell QV curve 26. That is, the charge curve between the electrodes of the secondary battery shown in the right graph of FIG. 3 is the full cell QV curve 26 in a sense that the full cell QV curve 26 is a curve that has combined the positive electrode PE and the negative electrode NE, which are half cells.

In this regard, the capacity degradation of the secondary battery are caused by the following four factors, and each of the factors appears in the positive electrode QV curve 22, the positive electrode QV curve 24 and the full cell QV curve 26. In FIG. 3, changes of the positive electrode QV curve 22, the negative electrode QV curve 24, and the full cell QV curve 26 after the degradation of the secondary battery are illustrated by two dot chain lines.

(1) Capacity decrease of the positive electrode PE→shift of the positive electrode QV curve 22 in the high current capacity region toward the low current capacity direction.

(2) Capacity decrease of the negative electrode NE→shift of the negative electrode QV curve 24 in the high current capacity region toward the low current capacity direction.

(3) Decrease of the lithium ions→gap in the current capacity caused by the shift of the positive electrode QV curve 22 in the low current capacity region toward the low current capacity direction and the shift of the negative electrode QV curve 24 in the low current capacity region toward the high current capacity direction.

(4) Resistance increase→increase in the difference in voltage direction between the positive electrode QV curve 22 and the negative electrode QV curve 24, or increase in the voltage offset in the full cell QV curve 26.

That is, the factors of the capacity degradation of the secondary battery have four parameters. Specifically, these parameters are the capacity decrease of the positive electrode PE, the capacity decrease of the negative electrode NE, the decrease of lithium ions, and the resistance increase. In the fitting operation, the positive electrode QV curve 22, the negative electrode QV curve 24, and the full cell QV curve 26 obtained by the destructive inspection of a reference battery are used as reference data 20, and the process of matching the reference data 20 with the target charge curve 10 is performed. The information processing apparatus 144 analyzes the capacity degradation of the target battery OB based on the variation amount of each of the parameters in this fitting operation.

As can be seen from the relationship between the four parameters and the positive electrode QV curve 22, the negative electrode QV curve 24, and the full cell QV curve 26, the parameters are in a state of being linked with each other on the charge curves. In the conventional fitting operation, adjustment of one parameter causes a change of the other parameter. Therefore, even if the target charge curve 10 and the reference data 20 were simply fitted to each other, it was not possible to determine which parameter is a true cause.

Therefore, in the method of estimating the internal degradation state of the degraded cell according to the embodiment of the present invention, the fitting unit 150 extracts feature points of a shape of the target charge curve 10, by differentiating the current capacity with respect to the voltage on the target charge curve 10 and obtaining a derivative. That is, as shown in FIG. 4, the target charge curve 10 represented by the current capacity and the voltage is converted into a characteristic curve represented by the current capacity and the derivative (dQ/dV). Hereinafter, this characteristic curve will be referred to as a target capacity characteristic curve 12. The right graph of FIG. 4 shows a target capacity characteristic curve 12 where the horizontal axis represents the current capacity and the vertical axis represents the derivative. In the internal degradation state estimation method, first, the converted target capacity characteristic curve 12 undergoes the fitting operation. In this manner, it becomes possible to temporarily disregard the parameter of the resistance increase (voltage offset).

In the right graph of FIG. 4, the derivative of the target capacity characteristic curve 12 has two peaks in the low current capacity (low SOC) region. Beyond two peaks in the direction in which the current capacity increases, the derivative of the target capacity characteristic curve 12 gradually decreases as the current capacity increases. Next, a correlation between the shape of the characteristics of the target capacity characteristic curve 12 and the shape of the characteristics of the positive electrode PE and the negative electrode NE of the battery will be described.

With regard to the positive electrode QV curve 22, the characteristic curve of the current capacity and the derivative obtained by differentiating the current capacity with respect to the voltage has a shape shown by a one dot chain line in the right graph of FIG. 4. Hereinafter, this characteristic curve will be referred to as a positive electrode characteristic curve 32. Further, with regard to the negative electrode QV curve 24, the characteristic curve of the current capacity and the derivative obtained by differentiating the current capacity with respect to the voltage has a shape shown by a two dot chain line in the right graph of FIG. 4. Hereinafter, this characteristic curve will be referred to as a negative electrode characteristic curve 34.

When the target capacity characteristic curve 12, the positive electrode characteristic curve 32, and the negative electrode characteristic curve 34 are compared with each other, in the low current capacity region, the shape of the target capacity characteristic curve 12 and the shape of the negative electrode characteristic curve 34 are similar to each other. That is, in the low current capacity region, the target capacity characteristic curve 12 shows a strong correlation with the negative electrode characteristic curve 34. Conversely, in the high current capacity (high SOC) region, the shape of the target capacity characteristic curve 12 and the shape of the positive electrode characteristic curve 32 are similar to each other. That is, in the high current capacity region, the target capacity characteristic curve 12 shows a strong correlation with the positive electrode characteristic curve 32.

In this regard, with respect to the lithium ion secondary battery, the correlation between the target capacity characteristic curve 12 and the negative electrode characteristic curve 34 in the low current capacity region is stronger than the correlation between the target capacity characteristic curve 12 and the positive electrode characteristic curve 32 in the high current capacity region. The target capacity characteristic curve 12 and the negative electrode characteristic curve 34 each have two peaks in the low current capacity region. It can be said that between the two peaks, the parameter of the capacity decrease of the positive electrode PE exerts almost no influence. Stated otherwise, in the low current capacity region, the parameter of the capacity decrease of the negative electrode NE is highly independent of the other parameters. On the other hand, the target capacity characteristic curve 12 and the positive electrode characteristic curve 32 in the high current capacity region do not have any clear peaks, and are affected by the parameter of the capacity decrease of the negative electrode NE.

Therefore, the fitting unit 150 fits positions where the correlation (independency) is strong to each other sequentially in the fitting operations of the target capacity characteristic curve 12 of the target battery OB and the positive electrode characteristic curve 32 and the negative electrode characteristics curve 34 included in the reference capacity characteristic curve 30. Specifically, the fitting unit 150 first performs low current capacity fitting operation of fitting the target capacity characteristic curve 12 and the negative electrode characteristic curve 34 (reference data 20) to each other in the low current capacity region. The low current capacity fitting operation eliminates a gap in the voltage direction by moving either one of the target capacity characteristic curve 12 or the negative electrode characteristic curve 34 in the voltage direction. In this manner, the parameter of the capacity decrease of the negative electrode NE is substantially adjusted.

Next, the fitting unit 150 performs a high current capacity fitting operation that fits the target capacity characteristic curve 12 and the positive electrode characteristic curve 32 (reference data 20) in the high current capacity region. In the high current capacity fitting operation, whichever of the target capacity characteristic curve 12 or the reference data 20 has been moved at the low current capacity fitting operation is moved in the voltage direction to eliminate a gap in the voltage direction. Thus, the parameter of the capacity decrease of the positive electrode PE is substantially adjusted. Further, in the high current voltage capacity fitting operation, whichever of the target capacity characteristic curve 12 or the reference data 20 has been moved at the low current capacity fitting operation is moved in the current capacity direction to eliminate a gap in the current capacity direction. In this way, the parameter of the decrease of lithium ions is substantially adjusted.

That is, the internal degradation estimation method according to the embodiment of the present invention can first provisionally fix the parameter of the capacity decrease of the negative electrode NE, by performing the low current capacity fitting operation before the high current capacity current fitting operation. Then, the high current capacity fitting operation can stably adjust both the parameter of the capacity decrease of the positive electrode PE and the parameter of the decrease of lithium ions, in the state where the parameter of the capacity decrease of the negative electrode NE has been provisionally fixed.

Further, the fitting unit 150 performs a voltage fitting operation of adjusting the parameter of the resistance increase (voltage offset) that has been disregarded in the low current capacity fitting operation and the high current capacity fitting operation. In this case, as shown in FIG. 5, the fitting unit 150 converts the target charge curve 10 of the target battery OB into a characteristic curve (hereinafter referred to as the target voltage characteristic curve 14) represented by the voltage and the derivative obtained by differentiating the current capacity with respect to voltage. At this time, the fitting unit 150 differentiates the current capacity with respect to voltage on the full cell QV curve 26, and converts the full cell QV curve 26 into a characteristic curve represented by the voltage and a derivative (hereinafter referred to as a full cell characteristic curve 42). That is, the full cell characteristic curve 42 corresponds to the reference voltage characteristic curve 40 calculated based on the reference data 20 obtained by the destructive inspection.

Stated otherwise, the fitting unit 150 converts, while extracting feature points of a shape by taking derivatives, converts the parameter of resistance increase that changes in the Y axis direction (voltage direction) on the target voltage characteristic curve 14 and the full cell characteristic curve 42 into the X axis direction as shown in the right graph of FIG. 5. The correlation between the target voltage characteristic curve 14 and the full cell characteristic curve 42 is weaker than the correlation between the target capacity characteristic curve 12 and the negative electrode characteristic curve 34 and the correlation between the target capacitance characteristic curve 12 and the positive electrode characteristic curve 32. It is because, as described above, the full cell QV curve 26 is calculated from the difference between the positive electrode QV curve 22 and the negative electrode QV curve 24, and is easily affected by the parameters of the capacity decrease of the positive electrode PE, the capacity decrease of the negative electrode NE, and the decrease of lithium ions.

Therefore, as a voltage fitting operation, the fitting unit 150 moves in the voltage direction (X axis direction) whichever of the target voltage characteristic curve 14 or the full cell characteristic curve 42 (reference data 20) has been moved during the high current capacity fitting operation, thereby eliminating the gap in the voltage direction. In this manner, the parameter of the resistance increase is substantially adjusted. That is, the method of estimating the internal degradation state first changes and provisionally fixes the parameters of the capacity decrease of the negative electrode NE, the capacity decrease of the positive electrode PE, and the decrease of lithium ions and in this fixed state, adjusts the parameter of the resistance increase. Therefore, the fitting unit 150 can set the changes of all the parameters that are factors of capacity degradation.

After the voltage fitting operation, the fitting unit 150 performs a fine adjustment fitting operation of finely adjusting a gap between the target charge curve 10 of the target battery OB and the reference data 20 (the negative electrode QV curve 24, the positive electrode QV curve 22, and the full cell QV curve 26). As described above, even if the characteristic curves obtained by taking derivatives of the current capacity with respect to the voltage are fitted to each other, there may be a minute gap on the charge curves represented by the current capacity and the voltage (the target charge curve 10 and the reference data 20 (the negative electrode QV curve 24, the positive electrode QV curve 22, and the full cell QV curve 26)). Therefore, the fitting unit 150 performs the fine adjustment operation on the charge curve at the end, thereby eliminating the minute gap.

In this fine adjustment fitting operation, the fitting unit 150 simultaneously adjusts the parameters of the capacity decrease of the positive electrode PE, the capacity decrease of the negative electrode NE, the decrease of lithium ions, and the resistance increase. Since each of the parameters has been almost adjusted by the low current capacity fitting operation, the high current capacity fitting operation, and the voltage fitting operation described above, the change in each of the parameters by the fine adjustment fitting operation is small.

Further, in the fine adjustment fitting operation, the fitting unit 150 may set an upper limit value and a lower limit value to each parameter of capacity degradation. In addition, the area of the charge curve used for the fine adjustment fitting operation may use all the current capacity=0 to 100% and may be divided into the low current capacity region used in the low current capacity fitting operation and the high current capacity region used in the high current capacity fitting operation.

The fitting unit 150 completes all the fitting operations by completion of the fine adjustment fitting operation. At the time of the completion, the fitting unit 150 stores each parameter of capacity degradation that has been changed by each fitting operation (the capacity decrease of the positive electrode PE, the capacity decrease of the negative electrode NE, the decrease of lithium ions, and the resistance increase) in the memory unit 148. In addition, the information processing apparatus 144 informs the user of each parameter of the analyzed capacity degradation through the reporting means (monitor, etc.) (not shown). Accordingly, the user can recognize the state of capacity degradation of the target battery OB.

In the internal degradation state estimation method, the measurement system 100 may perform an initial process of not only measuring the capacity degradation of a degraded (used) target battery OB but also extracting each parameter of capacity degradation concerning a not-yet-degraded (unused, new) target battery OB. In this way, the internal degradation state estimation method can obtain beforehand each parameter of the capacity degradation concerning the not-yet-degraded target battery OB with respect to the reference data 20. The information processing apparatus 144 stores each parameter of the not-yet-degraded target battery OB in the memory unit 148 and can use each parameter to estimate the capacity degradation of the degraded target battery OB. In other words, by adding to or subtracting from each parameter of the degraded target battery OB the difference between each parameter of the not-yet-degraded target battery OB and the reference data 20, it is possible to detect the degree of the capacity degradation in the degraded target battery OB more accurately.

The measurement system 100 according to the embodiment of the present invention is basically formed as described above. Hereinafter, the flow of the internal degradation state estimation method will be described with reference to FIGS. 6 and 7.

In the internal degradation estimation method, in order to estimate the capacity gradation of the target battery OB, a user measures the reference data 20 using the batteries of the same type and stores the reference data 20 beforehand in the memory unit 148 of the information processing apparatus 144 (step S10). As described above, the positive electrode QV curve 22 and the negative electrode QV curve 24 of the reference data 20 can be obtained by the destructive inspection of the same type of batteries. The full cell QV curve 26 is obtained from the positive electrode QV curve 22 and the negative electrode QV curve 24.

The internal degradation state estimation method next performs the initial process of checking the initial capacity degree concerning the not-yet-degraded target battery OB (step S20). In the initial process, the measurement system 100 charges the not-yet-degraded target battery OB with the charger 120. The charge current and the charge voltage at the time of the charging are accumulated in the data logger 142, whereby an initial charge curve (not shown) is obtained. The above fitting operation is performed between the initial charge curve and the reference data 20. The process flow of the fitting operation is the same as the estimation of the capacity degradation of the degraded target battery OB and will be described in detail in the process flow of an actual estimation process described later.

In the initial process, the measurement system 100 and the user can recognize the initial state of the target battery OB itself whose capacity degradation is actually estimated. The measurement system 100 stores in the memory unit 148 each of the parameters of the capacity decrease of the positive electrode PE, the capacity decrease of the negative electrode NE, the decrease of lithium ions, and the resistance increase in the not-yet-degraded target battery OB obtained through the initial process. Incidentally, it is possible to recognize the degradation state by only using the parameters of the capacity degradation obtained through the actual estimation process. Therefore, this initial process can be omitted.

Further, the internal degradation state estimation method performs the actual estimation process of estimating the capacity degradation concerning the degraded target battery OB (step S30). FIG. 7, in the actual estimation process, the measurement system 100 charges the degraded target battery OB with the charger 120 and accumulates in the data logger 142 the charge current and the charge voltage given at the time of charging (step S31). Then, the charge curve acquisition unit 146 of the information processing apparatus 144 obtains the target charge curve 10 based on the accumulated charge current and the charge voltage (step S32). Thereafter, the fitting unit 150 of the information processing apparatus 144 performs a fitting operation of the target charge curve 10 and the reference data 20.

In the fitting operation, as shown in FIGS. 8A and 8B, the fitting unit 150 differentiate the current capacity of the target charge curve 10 with respect to the voltage to obtain the derivative, and converts the target charge curve 10 into the target capacity characteristic curve 12. Likewise, the positive electrode QV curve 22 of the reference data 20 is converted into the positive electrode characteristic curve 32. Likewise, the negative electrode QV curve 24 of the reference data 20 is converted into the negative electrode characteristic curve 34 (step S33). FIG. 8A (and FIG. 9A, FIG. 10A, and FIG. 11A) illustrates, for ease of comparison of the target charge curve 10 with the reference data 20, the full cell QV curve 26, which is the difference between the positive electrode QV curve 22 and the negative electrode QV curve 24. As illustrated in FIG. 8A, before the fitting operation, there is a gap between the target charge curve 10 and the full cell QV curve 26.

With respect to the target capacity characteristic curve 12, the positive electrode characteristic curve 32, and the negative electrode characteristic curve 34, the fitting unit 150 sequentially extracts regions where the correlation (independency) is strong, and performs the fitting operation in the order of the strong correlation. Specifically, the fitting unit 150 first performs the low current capacity fitting operation of fitting the target capacity characteristic curve 12 and the negative electrode characteristic curve 34 in the low current capacity region (where the current capacity is approximately in the range of 0% to 30%) (step S34). In this manner, as shown in FIG. 9B, one of the target capacity characteristic curve 12 and the negative electrode characteristic curve 34 (the negative electrode characteristic curve 34 in FIG. 9B) is moved in the derivative direction, and the gap in the derivative direction is eliminated. Then, by the low current capacity fitting operation, the parameter of the capacity decrease of the negative electrode NE changes. In the graph illustrated in FIG. 9A, by the low current capacity fitting operation, the target charge curve 10 and the full cell QV curve 26 slightly approach each other in the low current capacity region.

Next, the fitting unit 150 performs high current capacity fitting operation of fitting the target capacity characteristic curve 12 and the positive electrode characteristic curve 32 in the high current capacity region (where the current capacity is approximately in the range of 80% to 100%) (step S35). As a result, as shown in FIG. 10B, one of the target capacity characteristic curve 12 and the positive electrode characteristic curve 32 (the positive electrode characteristic curve 32 in FIG. 10B) is moved in the derivative direction and the current capacity direction, and the gaps in the derivative direction and the current capacity direction are eliminated. Then, by the high current capacity fitting operation, the parameters of the capacity decrease of the positive electrode PE and the decrease of lithium ions changes. In the graph illustrated in FIG. 10A, by the high current capacity fitting operation, the target charge curve 10 and the full cell QV curve 26 approach each other in the high current capacity region, and the current capacity of the full cell QV curve 26 significantly drops. Stated otherwise, it can be said that the capacity decrease of the illustrated target battery OB is largely attributed to the parameter of the decrease of lithium ions.

Next, the fitting unit 150 converts the target charge curve 10 into the target voltage characteristic curve 14. Likewise, the fitting unit 150 converts the full cell QV curve 26 of the reference data 20 into the full cell characteristic curve 42 (step S36). Further, the fitting unit 150 performs the voltage fitting operation of fitting the target voltage characteristic curve 14 and the full cell characteristic curve 42 to each other (step S37). As a result, as shown in FIG. 11B, one of the target voltage characteristic curve 14 and the full cell characteristic curve 42 (full cell characteristic curve 42 in FIG. 11B) is moved in the voltage direction, and the gap in the voltage direction is eliminated. Then, by the voltage fitting operation, the parameter of the resistance increase is changed. In the graph illustrated in FIG. 11A, by the voltage fitting operation, the target charge curve 10 and the full cell QV curve 26 substantially match each other.

At the end of the fitting operation, the fitting unit 150 performs the fine adjustment fitting operation (step S38). As a result, the fitting unit 150 eliminates the minute gap between the target charge curve 10 and the reference data 20 (the positive electrode QV curve 22, the negative electrode QV curve 24, and the full cell QV curve 26) and can fit the target charge curve 10 and the reference data 20 to each other.

After the above actual estimation process is finished, as shown in FIG. 6, the information processing apparatus 144 compares each parameter of the capacity degradation obtained in the initial process and the actual estimation process, estimates the degradation state of the target battery OB, and reports the information by suitable reporting means (step S40). For example, the information processing apparatus 144 performs addition or subtraction of each parameter of the capacity degradation of the initial process and each parameter of the capacity degradation of the actual estimation process. As a result, when the user looks at the estimation result reported by the information processing apparatus 144, the user can accurately identify the degradation state of the degraded target battery OB.

The present invention is not limited to the above embodiment, and various modification can be made in line with the gist of the present invention. For example, in the internal degradation state estimation method of the degradation cell according to the embodiment of the present invention, the fitting operation of performing the low current capacity region where the correlation is strong on the characteristic curve is first performed. However, in the internal degradation state estimation method, in a case where the correlation in the high current capacity region is stronger than that in the low current capacity region on the characteristic curve, the fitting operation in the high current capacity region may be first performed. The fitting unit 150 may calculate a correlation coefficient between the target capacity characteristic curve 12, and the positive electrode characteristic curve 32 and the negative electrode characteristic curve 34 by known calculation means, and determine the order of the fitting operations based on the correlation coefficient.

The number of the low current capacity fitting operations (fitting between the target capacity characteristic curve 12 and the negative electrode characteristic curve 34) and the number of the high current capacity fitting operations (fitting between the target capacity characteristic curve 12 and the positive electrode characteristic curve 32) are not limited to one. For example, after the low current capacity fitting operation, the high current capacity fitting operation may be performed, and thereafter, the low current capacity fitting operation may be performed again. Alternatively, after the high current capacity fitting operation, the low current capacity fitting operation may be performed, and thereafter, the high current capacity fitting operation may be performed again. In this manner, by performing the low current capacity fitting operation and the high current capacity fitting operation alternately multiple times, it is possible to improve the fitting accuracy.

The technical concept and advantages understood from the above embodiment will be described below.

According to a first aspect of the present invention, a method of estimating an internal degradation state of a degraded cell is provided. The method includes obtaining the target charge curve 10 represented by the current capacity and the voltage for the target battery OB that is a target of estimation of capacity degradation, obtaining a derivative by differentiating the current capacity by the voltage on the target charge curve 10 and calculating the target capacity characteristic curve 12 represented by the current capacity and the derivative, calculating, for another battery of the same type as the target battery OB, the reference capacity characteristic curve 30 represented by the current capacity and the derivative, based on reference data 20 including the current capacity and the voltage, and, performing an actual estimation process of estimating capacity degradation of the target battery OB by obtaining changes of parameters of different types based on fitting operation of fitting the reference capacity characteristic curve 30 and the target capacity characteristic curve 12 to each other. In the fitting operation, the reference capacity characteristic curve 30 and the target capacity characteristic curve 12 are separated into parts in a low current capacity region and parts in a high current capacity region, and whichever parts in either one of the low current capacity region or the high current capacity region have a stronger correlation are fit to each other first, and the other parts having a weaker correlation are fit to each other later.

According to the above, in the internal degradation state estimation method of the degraded cell, it is possible to perform a fitting operation, taking account of the electrochemical characteristics of the battery. That is, in the internal degradation state estimation method, by calculating the target capacity characteristic curve 12 from the charge curve, it is possible to limit the parameters of different types for estimating capacity degradation. Further, in the fitting operation, whichever of low current capacity regions and high current capacity regions of the reference capacity characteristic curve 30 and the target capacity characteristic curve 12 have a stronger correlation are fit to each other first. In this manner, it is possible to first set the parameter having a stronger correlation. Accordingly, it is possible to improve the reproducibility, the reliability, and the easiness of understanding of the estimation of the batter capacity degradation.

Further, in the fitting operation, a low current capacity fitting operation of fitting the reference capacity characteristic curve 30 and the target capacity characteristic curve 12 in the low current capacity region having the stronger correlation is performed. Thereafter, a high current capacity fitting operation of fitting the reference capacity characteristic curve 30 and the target capacity characteristic curve 12 in the high current capacity region having the weaker correlation is performed. In this manner, in the internal degradation state estimation method, by performing the fitting operation in the order of the low current capacity region and the high current capacity region, it is possible to extract changes of, among the parameters of different types, parameters of the capacity decrease of the negative electrode NE, the capacity decrease of the positive electrode PE, and the decrease of lithium ions.

Further, a derivative is obtained by differentiating the current capacity by the voltage on the target charge curve 10 to calculate the target voltage characteristic curve 14 represented by the voltage and the derivative. In the fitting operation, after the reference capacity characteristic curve 30 and the target capacity characteristic curve 12 are fitted to each other, the voltage fitting operation is performed that fits the target voltage characteristic curve 14 and the reference voltage characteristic curve 40 that is obtained by differentiating the current capacity by the voltage based on the reference data 20. In this manner, in the internal degradation estimation method, it is possible to stably extract the parameter of the voltage offset due to the resistance increase.

Further, in the fitting operation, after the voltage fitting operation, the fine adjustment fitting operation of fitting the target charge curve 10 and the reference data 20 (full cell QV curve 26) to each other by fine adjustment is performed. In this manner, in the internal degradation estimation method, even if a minute gap is produced by the fitting operation where the characteristic curve is used, such a gap is eliminated by the fine adjustment fitting operation. Therefore, in the internal degradation estimation method, it is possible to estimate the capacity degradation of the target battery OB more accurately.

Further, the method includes an initial process of obtaining the target charge curve 10 of the not-yet-degraded target battery OB, and obtaining the changes of the parameters of different types of the not-yet-degraded target battery OB based on the target charge curve 10. In the actual estimation process, the capacity degradation of the target battery OB is estimated base on the parameters of the different types obtained in the actual estimation process, and the parameters of different types obtained in the initial process. In this manner, in the internal degradation state estimation method, by using the plurality of types of parameters of the initial process and the plurality of types of parameters of the actual estimation process, it is possible to suitably recognize the changes of the parameters of the capacity degradation.

Further, the reference data 20 is obtained by destructing a battery of the same type as the target battery OB and separating the battery into a positive electrode PE and a negative electrode NE. The reference data 20 includes the positive electrode QV curve 22 represented by the current capacity and the voltage at the time of charging the positive electrode PE, and the negative electrode QV curve 24 represented by the current capacity and the voltage at the time of charging the negative electrode NE. In this manner, by applying to the reference data 20 the positive electrode QV curve 22 and the negative electrode QV curve 24 obtained by destructing the battery, the internal degradation state estimation method makes it possible to accurately obtain the reference data 20 for estimating the capacity degradation of the target battery OB.

Further, in the fitting operation, each of the positive electrode characteristic curve 32 obtained by differentiating the current capacity by the voltage on the positive electrode QV curve 22 and the negative electrode characteristic curve 34 obtained by differentiating the current capacity by the voltage on the negative electrode QV curve 24 is individually fitted to the target capacity characteristic curve 12. In this manner, by fitting the target capacity characteristic curve 12 and the negative electrode characteristic curve 34 to each other, the internal degradation state estimation method makes it possible to suitably obtain the parameter of the capacity decrease of the negative electrode NE. Further, by fitting the target capacity characteristic curve 12 and the positive electrode characteristic curve 32 to each other, the internal degradation estimation method makes it possible to suitably obtain the parameter of the capacity decrease of the positive electrode PE.

Further, according to a second aspect of the present invention, the measurement system 100 is provided. The measurement system 100 performs a method of estimating an internal degradation state of a degraded cell. The measurement system 100 includes the charger 120 that charges a target battery OB that is a target of estimation of capacity degradation, and the estimation apparatus 140 connected to the charger 120. The estimation apparatus 140 is configured to obtain the target charge curve 10 represented by the current capacity and the voltage based on charge current and charge voltage supplied to the target battery OB, obtain a derivative by differentiating the current capacity by the voltage on the target charge curve 10, calculate the target capacity characteristic curve 12 represented by the current capacity and the derivative, calculate, for another battery of the same type as the target battery OB, the reference capacity characteristic curve 30 represented by the current capacity and the derivative based on reference data 20 including the current capacity and the voltage, and perform an actual estimation process of estimating capacity degradation of the target battery OB by obtaining changes of parameters of different types based on a fitting operation of fitting the reference capacity characteristic curve 30 and the target capacity characteristic curve 12 to each other. In the fitting operation, the reference capacity characteristic curve 30 and the target capacity characteristic curve 12 are separated into parts in a low current capacity region and parts in a high current capacity region, and whichever of parts in either one of the low current capacity region or the high current capacity region have a stronger correlation is fit to each other first and the other parts having a weaker correlation are fit to each other later. In this manner, in the measurement system 100, by performing the fitting operation taking account of the electrochemical characteristic of the battery, it is possible to improve the reproducibility, the reliability, and the easiness of understanding of the battery capacity degradation.

What is claimed is:

1. A method of estimating an internal degradation state of a degraded cell, the method comprising:
    obtaining a target charge curve represented by current capacity and voltage for a target battery that is a target of estimation of capacity degradation;
    obtaining a derivative by differentiating the current capacity with respect to the voltage on the target charge curve and calculating a target capacity characteristic curve represented by the current capacity and the derivative;
    calculating, for another battery of the same type as the target battery, a reference capacity characteristic curve represented by the current capacity and the derivative, based on reference data including the current capacity and the voltage; and
    performing an actual estimation process of estimating capacity degradation of the target battery by obtaining changes of parameters of different types based on fitting operation of fitting the reference capacity characteristic curve and the target capacity characteristic curve to each other,
    wherein, in the fitting operation, the reference capacity characteristic curve and the target capacity characteristic curve are separated into parts in a low current capacity region and parts in a high current capacity region, and whichever parts in either one of the low current capacity region or the high current capacity region have a stronger correlation are fit to each other first and the other parts having a weaker correlation are fit to each other later,
    the fitting operation first performs a low current capacity fitting operation of fitting the reference capacity characteristic curve and the target capacity characteristic curve to each other in the low current capacity region that has the stronger correlation, and
    thereafter performs a high current capacity fitting operation of fitting the reference capacity characteristic curve and the target capacity characteristic curve in the high current capacity region that has the weaker correlation.

2. The method to claim 1, comprising
    obtaining, for the target charge curve, a derivative by differentiating the current capacity with respect to the voltage, and calculating a target voltage characteristic curve represented by the voltage and the derivative,
    wherein after the reference capacity characteristic curve and the target capacity characteristic curve are fit to each other, the fitting operation obtains a derivative by differentiating the current capacity with respect to the voltage, based on the reference data, calculates a reference voltage characteristic curve represented by the voltage and the derivative, and fits the reference voltage characteristic curve and the target voltage characteristic curve to each other.

3. The method according to claim 2, wherein after the voltage fitting operation, the fitting operation performs an adjustment that eliminates a minute gap between the target charge curve and the reference data.

4. The method according to claim 1, comprising performing an initial process of
obtaining a target charge curve of a not-yet-degraded target battery, and
obtaining changes of parameters of different types of the not-yet-degraded target battery based on the target charge curve,
wherein the actual estimation process estimates the capacity degradation of the target battery based on the parameters of the different types obtained in the actual estimation process and the parameters of the different types obtained in the initial process.

5. The method according to claim 1, wherein the reference data is obtained by destructing the target battery and another battery of the same type and separating a positive electrode and a negative electrode, and includes a positive electrode QV curve represented by the voltage and the current capacity given at the time of charging the positive electrode and a negative electrode QV curve represented by the voltage and the current capacity given at the time of charging the negative electrode.

6. The method according to claim 5, wherein the fitting operation fits each of a positive electrode characteristic curve obtained by differentiating the current capacity with respect to the voltage on the positive electrode QV curve and a negative electrode characteristic curve obtained by differentiating the current capacity with respect to the voltage on the negative electrode QV curve is individually fitted to the target capacity characteristic curve.

7. A measurement system configured to perform a method of estimating an internal degradation state of a degraded cell, the measurement system comprising:
a charger configured to charge a target battery that is a target of estimation of capacity degradation; and
an estimation apparatus connected to the charger,
wherein the estimation apparatus is configured to:
obtain a target charge curve represented by current capacity and voltage based on charge current and charge voltage supplied to the target battery;
obtain a derivative by differentiating the current capacity with respect to the voltage on the target charge curve and calculate a target capacity characteristic curve represented by the current capacity and the derivative;
calculate, for another battery of the same type as the target battery, a reference capacity characteristic curve represented by the current capacity and the derivative based on reference data including the current capacity and the voltage, and
perform an actual estimation process of estimating capacity degradation of the target battery by obtaining changes of parameters of different types based on a fitting operation of fitting the reference capacity characteristic curve and the target capacity characteristic curve to each other,
wherein, in the fitting operation, the reference capacity characteristic curve and the target capacity characteristic curve are separated into parts in a low current capacity region and parts in a high current capacity region, and whichever parts in either one of the low current capacity region or the high current capacity region have a stronger correlation are fit to each other first and the other parts having a weaker correlation are fit to each other later,
the fitting operation first performs a low current capacity fitting operation of fitting the reference capacity characteristic curve and the target capacity characteristic curve to each other in the low current capacity region that has the stronger correlation, and
thereafter performs a high current capacity fitting operation of fitting the reference capacity characteristic curve and the target capacity characteristic curve in the high current capacity region that has the weaker correlation.

8. A method of estimating an internal degradation state of a degraded cell, the method comprising:
obtaining a target charge curve represented by current capacity and voltage for a target battery that is a target of estimation of capacity degradation;
obtaining a derivative by differentiating the current capacity with respect to the voltage on the target charge curve and calculating a target capacity characteristic curve represented by the current capacity and the derivative;
calculating, for another battery of the same type as the target battery, a reference capacity characteristic curve represented by the current capacity and the derivative, based on reference data including the current capacity and the voltage; and
performing an actual estimation process of estimating capacity degradation of the target battery by obtaining changes of parameters of different types based on fitting operation of fitting the reference capacity characteristic curve and the target capacity characteristic curve to each other,
wherein, in the fitting operation, the reference capacity characteristic curve and the target capacity characteristic curve are separated into parts in a low current capacity region and parts in a high current capacity region, and whichever parts in either one of the low current capacity region or the high current capacity region have a stronger correlation are fit to each other first and the other parts having a weaker correlation are fit to each other later,
wherein the method further includes performing an initial process of
obtaining a target charge curve of a not-yet-degraded target battery, and
obtaining changes of parameters of different types of the not-yet-degraded target battery based on the target charge curve,
wherein the actual estimation process estimates the capacity degradation of the target battery based on the parameters of the different types obtained in the actual estimation process and the parameters of the different types obtained in the initial process.

\* \* \* \* \*